(12) United States Patent
Shih

(10) Patent No.: US 11,317,532 B2
(45) Date of Patent: Apr. 26, 2022

(54) LABOR-SAVING MAINBOARD WITHDRAWING STUCTURE FOR ELECTRONIC DEVICES

(71) Applicant: PORTWELL INC., New Taipei (TW)

(72) Inventor: Ya-Tzu Shih, New Taipei (TW)

(73) Assignee: PORTWELL INC., New Taipei (TW)

( * ) Notice: Subject to any disclaimer, the term of this patent is extended or adjusted under 35 U.S.C. 154(b) by 27 days.

(21) Appl. No.: 16/951,749

(22) Filed: Nov. 18, 2020

(65) Prior Publication Data

US 2022/0030735 A1    Jan. 27, 2022

(30) Foreign Application Priority Data

Jul. 23, 2020    (TW) .................................. 109209465

(51) Int. Cl.
*H05K 7/14* (2006.01)
*G06F 1/18* (2006.01)

(52) U.S. Cl.
CPC ........... *H05K 7/1489* (2013.01); *G06F 1/184* (2013.01); *H05K 7/1407* (2013.01)

(58) Field of Classification Search
CPC .. H05K 7/1489; H05K 7/1407; H05K 7/1409; H05K 7/1411; H05K 5/0221; H05K 5/0295; H05K 5/0204; H05K 7/1401; G06F 1/184; G06F 1/187; G06F 1/185; G06F 1/186; A47B 88/407; H01R 12/722; H01R 13/629
See application file for complete search history.

(56) References Cited

U.S. PATENT DOCUMENTS

| | | | | | |
|---|---|---|---|---|---|
| 3,691,430 | A | * | 9/1972 | Freitag | H05K 7/1409 361/801 |
| 4,083,616 | A | * | 4/1978 | McNiece | H01R 12/7005 439/157 |
| 4,152,038 | A | * | 5/1979 | Inouye | H01R 12/88 439/153 |
| 4,313,150 | A | * | 1/1982 | Chu | H05K 7/1409 439/153 |
| 4,638,405 | A | * | 1/1987 | Smith | H05K 7/1407 439/325 |

(Continued)

*Primary Examiner* — Michael A Matey
(74) *Attorney, Agent, or Firm* — Muncy, Geissler, Olds & Lowe, P.C.

(57) ABSTRACT

A labor-saving mainboard withdrawing structure for electronic devices is used for withdrawing a mainboard from a slot in a withdrawing direction, and the structure includes a fixed seat, a movable seat installed separately on both sides of the fixed seat and limited to move in the withdrawing direction only and having a space defined between the two movable seats for installing the mainboard, and a rail track disposed on an opposite side and extending along the withdrawing direction for slidably inserting the mainboard. Each movable seat has a pushing portion and a pushing member abutting against the mainboard, and each pushing member has a head provided for operator to push, and a tail abutting against the fixed seat, and the head can be pushed to move the tail pivotally, and when the tail is moved pivotally, the movable seat is pushed to move a retreat distance in the withdrawing direction relative to the fixed seat, so as to detach the mainboard from the slot by pushing the pushing portion.

8 Claims, 7 Drawing Sheets

(56) References Cited

U.S. PATENT DOCUMENTS

| | | | | |
|---|---|---|---|---|
| 4,896,777 A * | 1/1990 | Lewis | G11B 33/08 | 361/759 |
| 5,139,430 A * | 8/1992 | Lewis | H05K 7/1409 | 439/157 |
| 5,542,854 A * | 8/1996 | Bowen | H01R 12/7005 | 439/157 |
| 5,676,555 A * | 10/1997 | Yu | H05K 7/1409 | 439/328 |
| 5,793,614 A * | 8/1998 | Tollbom | H05K 7/1409 | 361/801 |
| 5,805,420 A * | 9/1998 | Burke | H11B 33/128 | |
| 6,113,402 A * | 9/2000 | Joo | H01R 12/7005 | 439/157 |
| 6,147,872 A * | 11/2000 | Roy | H05K 7/1409 | 361/801 |
| 6,381,146 B1 * | 4/2002 | Sevier | H05K 7/1411 | 361/740 |
| 6,582,241 B1 * | 6/2003 | Lutz, Jr. | H01R 12/7005 | 439/157 |
| 6,749,448 B2 * | 6/2004 | Bright | H05K 7/20418 | 439/152 |
| 6,961,249 B2 * | 11/2005 | Wong | H05K 7/1409 | 361/801 |
| 7,015,405 B2 * | 3/2006 | Yang | H01H 3/16 | 200/296 |
| 7,083,444 B1 * | 8/2006 | Barina | H05K 7/1409 | 439/372 |
| 7,245,499 B2 * | 7/2007 | Stahl | H05K 7/1409 | 361/740 |
| 7,510,416 B2 * | 3/2009 | Sato | H05K 7/1409 | 439/159 |
| 7,513,693 B2 * | 4/2009 | Wang | G02B 6/4284 | 385/56 |
| 8,325,487 B2 * | 12/2012 | Yamaguchi | H05K 7/1489 | 361/752 |
| 10,219,401 B1 | 2/2019 | Cheng et al. | | |
| 10,765,028 B1 * | 9/2020 | Beall | H05K 7/1489 | |
| 2004/0174686 A1 * | 9/2004 | Rubenstein | H05K 7/1409 | 361/801 |
| 2005/0243533 A1 * | 11/2005 | Malone | H05K 7/1421 | 361/801 |
| 2007/0258224 A1 * | 11/2007 | Fang | H05K 7/1409 | 361/759 |
| 2010/0134989 A1 * | 6/2010 | Strmiska | H05K 7/1418 | 361/759 |
| 2010/0279531 A1 * | 11/2010 | Li | G06K 13/0806 | 439/159 |
| 2012/0129377 A1 * | 5/2012 | Chen | H01R 12/721 | 439/327 |
| 2012/0275120 A1 * | 11/2012 | Nguyen | G02B 6/4292 | 361/747 |
| 2013/0107424 A1 * | 5/2013 | Thomas | H05K 7/1489 | 361/679.01 |
| 2014/0078681 A1 * | 3/2014 | Nguyen | G02B 6/4246 | 361/726 |
| 2014/0170875 A1 * | 6/2014 | Shen | H01R 12/737 | 439/325 |
| 2014/0185247 A1 * | 7/2014 | Dittus | H05K 7/1409 | 361/728 |
| 2015/0146372 A1 * | 5/2015 | French, Jr. | H05K 7/1489 | 29/854 |
| 2016/0242307 A1 * | 8/2016 | Qi | G06F 1/185 | |
| 2017/0048992 A1 * | 2/2017 | Katsaros | H05K 5/0204 | |
| 2018/0102608 A1 * | 4/2018 | Sun | G06F 1/185 | |

* cited by examiner

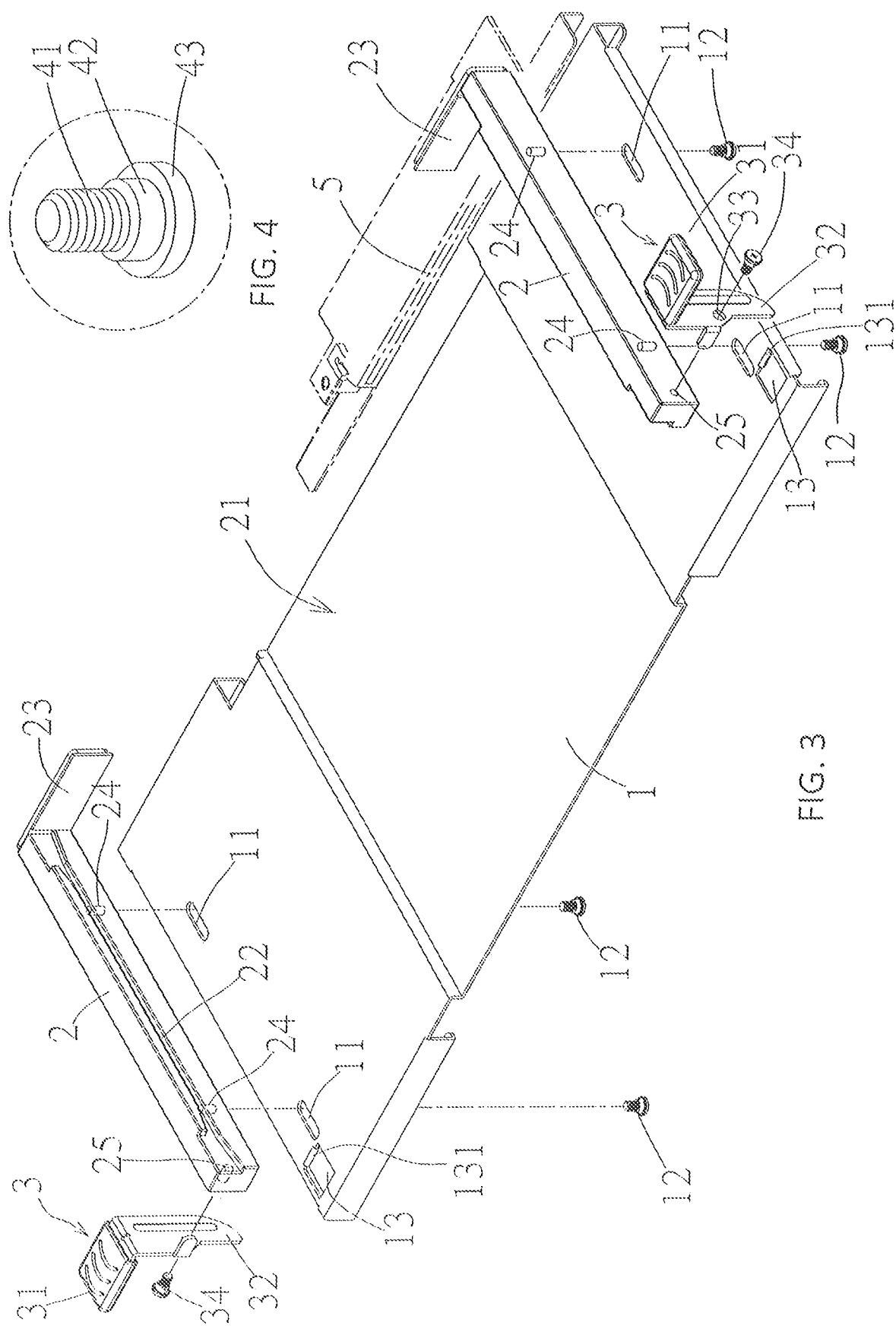

LABOR-SAVING MAINBOARD WITHDRAWING STUCTURE FOR ELECTRONIC DEVICES

FIELD OF THE INVENTION

The present invention relates to a mainboard of an electronic device, and more particularly to a mainboard withdrawing structure.

BACKGROUND OF THE INVENTION

1. Description of the Related Art

In general, an electronic device relies on a mainboard to carry out operations of different functions. The mainboard is plugged into a slot according to the requirement of use. For example, the mainboard or a display interface card of an industrial computer is mounted and installed onto a computer motherboard. In order to function correctly, the mainboard must be inserted into the slot tightly and securely to prevent it from falling off. The convenience and easiness of pulling out the mainboard are usually not taken into consideration, and thus it is quite troublesome for operators to pull out the mainboard from the slot.

During a quality inspection process of the manufactured mainboards, the mainboards are plugged into the respective slots one by one, and then the plugged mainboards are replaced by some other mainboards right after the inspection, and thus the mainboards have to be pulled out from the slots frequently. However, a general mainboard usually does not have the design of a structure for pulling out the mainboard easily, so that an operator often needs to hold a heat sink 71 of the mainboard 7 by a hand as shown in FIG. 1 and uses it as a force applying point to pull out the mainboard 7, or directly holds the mainboard 7 by a hand to pull out the mainboard 7, so that it is easy to cause a failure of the heat sink 71 or the mainboard 7. Furthermore, if the mainboard 7 is placed horizontally, there will be insufficient space provided for the operator to hold the mainboard tightly to pull out the mainboard 7 in the horizontal direction, and the level of difficulty of applying force will become higher which may damage the mainboard 7 easily.

In view of the aforementioned problems, it is a main subject of this invention to provide a feasible solution to overcome the difficulty of withdrawing the mainboard.

2. Summary of the Invention

Therefore, it is a primary objective of the present invention to provide a mainboard withdrawing structure for electronic devices, and the structure can be used to pull out a mainboard from a slot easily and effortlessly, thus not just providing a convenient operation only, but also preventing damages to the mainboard.

To achieve the aforementioned and other objectives, the present invention discloses a labor-saving mainboard withdrawing structure for electronic devices, configured to be corresponsive to a slot, and provided for withdrawing a mainboard out from the slot in a withdrawing direction, characterized in that the withdrawing structure comprises: a fixed seat; two movable seats, installed on both sides of the fixed seat, and limited to move in the withdrawing direction only, and having a space defined between the two movable seats for installing the mainboard, a rail track formed on an opposite side and extending along the withdrawing direction for slidably inserting the mainboard, and the two movable seats having a pushing portion separately for abutting against the mainboard; and two pushing members, pivoted at one of the movable seats corresponsively, and each pushing member having a head provided for operators to push and a tail abutting against the fixed seat, and a through hole being formed on the fixed seat and configured to be corresponsive to each respective pushing member, and the tail of each pushing member passing and extending into the corresponding through hole, and each head being pushed to pivot each tail, and each tail abuts against a front side of the corresponding through hole, and each movable seat being pushed in a retreat distance along the withdrawing direction relative to the fixed seat when each movable seat is pivoted at each tail, so as to detach the mainboard from the slot by pushing each pushing portion.

Preferably, the retreat distance is greater than the depth of inserting the mainboard into the slot, so that the mainboard can be separated completely from the slot when the movable seat is moved.

Preferably, each pushing member has a corresponding positioning hole formed between the head and the tail, and a positioning member is passed through the positioning hole to position each pushing member onto the movable seat.

Each positioning member comprises a threaded section, a middle section and a cap integrally and sequentially coupled to each other, and the middle section has an outer diameter falling within a range between the outer diameter of the threaded section and the outer diameter of the cap, and the threaded section is locked into a screw hole of the movable seat, and the middle section is passed into the corresponding positioning hole.

Preferably, the tail of each pushing member abutting against a side with the corresponding through hole is in an arc shape.

The fixed seat has at least one long hole configured to be corresponsive to the two movable seats and extending along the withdrawing direction, and the movable seat has a limit member configured to be corresponsive to the long hole and passed through the long hole, so that the movable seat is limited by the limit member to move within the range of the long hole only.

Preferably, each long hole has a length greater than the depth of inserting the mainboard into the slot, so that the mainboard can be separated completely from the slot when the movable seat is moved.

Each limit member comprises a threaded section, a middle section and a cap integrally and sequentially coupled to each other, and the middle section has an outer diameter falling within a range between the outer diameter of the threaded section and the outer diameter of the cap, and the threaded section is locked into a screw hole of the movable seat, and the middle section is passed into the long hole.

In summation of the description above, the present invention can make the withdrawal of the mainboard easier and more effort-saving without causing too much physical burden, so as to improve the efficiency of the mainboard testing. In addition, the invention also can ensure a correct withdraw of the mainboard to protect the product from damage or failure.

The above and other objects, features and advantages of this disclosure will become apparent from the following detailed description of the specification together with the illustration of the accompanying drawings.

BRIEF DESCRIPTION OF THE DRAWINGS

FIG. 3 is an exploded view of the present invention;

FIG. 4 is a perspective view of a positioning member and a limit member of the present invention;

BRIEF DESCRIPTION OF NUMERALS USED IN THE DRAWINGS

1: Fixed seat; 11: long hole; 12: Limit member; 13: Through hole; 131: Front side; 2: Movable seat; 21: Space: 22: Rail track; 23: Pushing portion; 24: Screw hole; 25: Screw hole; 3: Pushing member; 31: Head; 32: Tail; 33: Positioning hole; 34: Positioning member; 41: Threaded section; 42: Middle section; 43: Cap; 5: Slot; D: Withdrawing direction; and 6: Mainboard.

DESCRIPTION OF THE PREFERRED EMBODIMENTS

Figure 1:
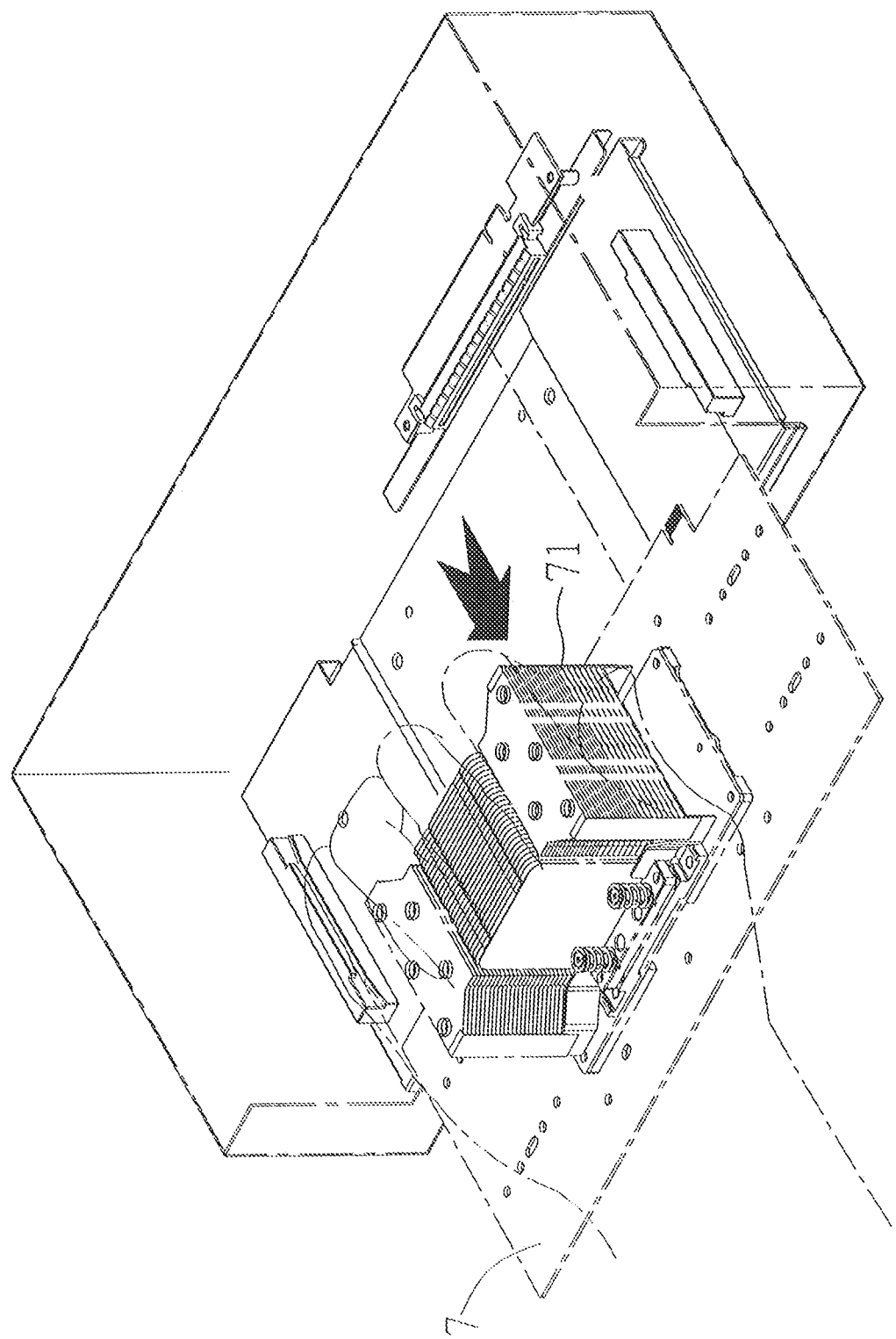
FIG. 1 is a schematic view of uninstalling a conventional mainboard of an electronic device.
Figure 2:
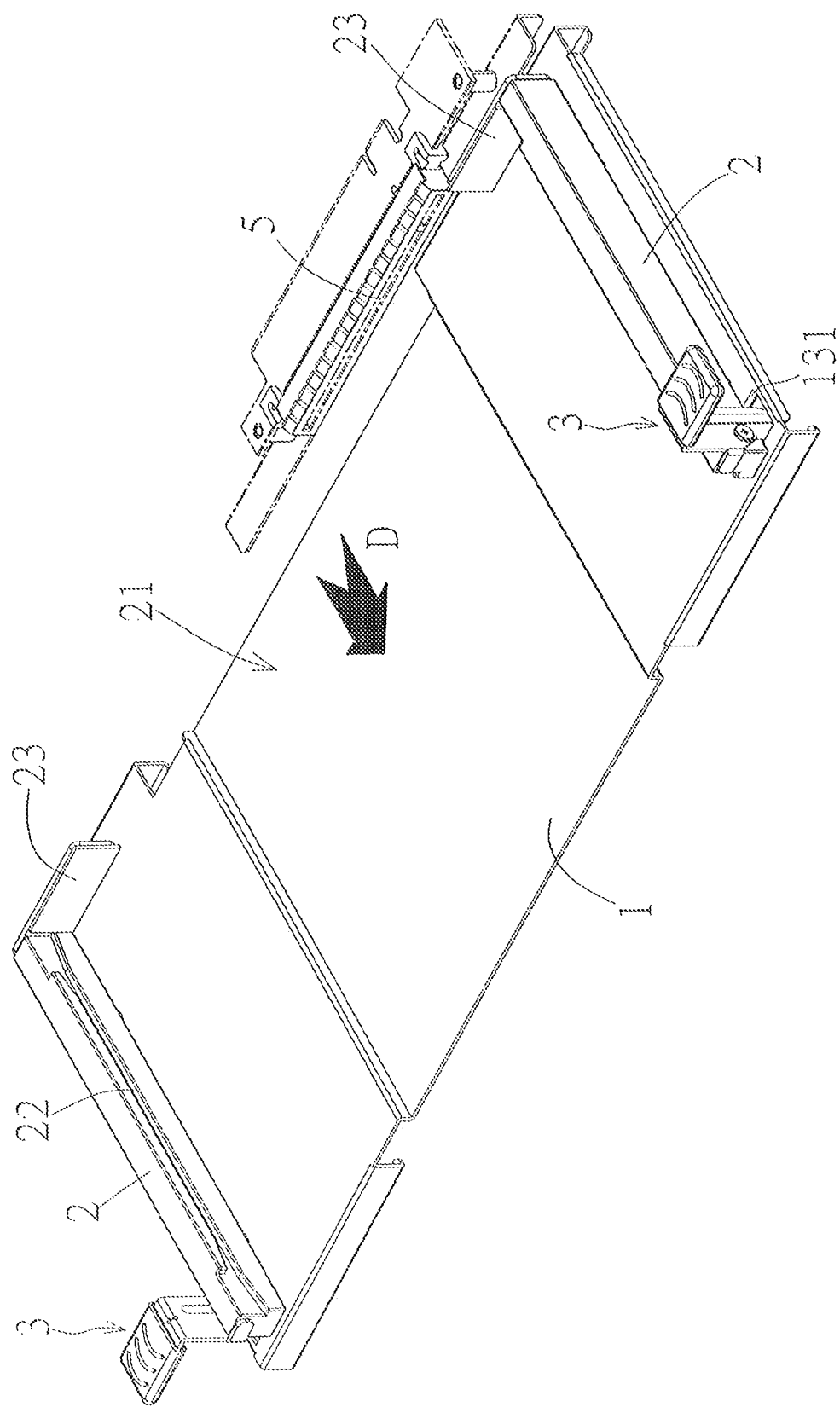
FIG. 2 is a perspective view of the present invention.

With reference to FIGS. 2 and 3 for a labor-saving mainboard withdrawing structure for electronic devices of the present invention, the mainboard withdrawing structure is installed at the front of a slot 5 and providing for pulling out a mainboard 6 from the slot 5 in a withdrawing direction D. The withdrawing structure comprises a fixed seat 1, two movable seats 2 and two pushing members 3.

The fixed seat 1 comprises a wide board, a movable seat 2 disposed on both sides of the fixed seat 1, a space 21 defined between the two movable seats 2 for installing a mainboard. The two movable seats 2 have a rail track 22 formed on an opposite side and extending along the withdrawing direction D for slidably inserting the mainboard, so as to limit and guide the movement of the mainboard. A pushing portion 23 outwardly extends from an end of each movable seat 2 adjacent to the slot 5 towards the space 21, and each pushing portion 23 abuts against the mainboard to control its movement. In this embodiment, the slot 5 includes but not limited to a PCI slot or a PCIE slot.

The fixed seat 1 has two long holes 11 configured to be corresponsive to each movable seat 2 and extending along the withdrawing direction D, and at least one limit member 12 passing through the long hole 11 and locked to the movable seat 2, so that each movable seat 2 is limited by the limit member 12 to move within the range of the long hole 11 only. In other words, each movable seat 2 can move in the withdrawing direction D only. In this embodiment, the length of each long hole 11 is greater than the depth of inserting the mainboard into the slot 5.

Each of the limit members 12 is a screw as shown in FIG. 4 and comprises a threaded section 41 with a screw thread which is integrally and sequentially coupled to another threaded section 41 of another limited member 12, a middle section 42 without any screw thread, and a cap 43, wherein the threaded section 41 has an outer diameter smaller than the outer diameter of the middle section 42, and the middle section 42 has an outer diameter smaller than the outer diameter of the cap 43. The threaded section 41 is locked into a screw hole 24 of the corresponding movable seat 2, and the middle section 42 is passed and extended into the corresponding long hole 11 to limit a moving range of the movable seat 2.

Each movable seat 2 comes with a pushing member 3 configured to be corresponsive to each other. Each pushing member 3 comprises a head 31 and a tail 32, and a positioning hole 33 is formed between the head 31 and the tail 32, and a positioning member 34 is passed through the corresponding positioning hole 33 to position the corresponding pushing member 3 on the corresponding movable seat 2. Each positioning member 34 is a screw as shown in FIG. 4, and the threaded section 41 of the positioning member 34 is locked into a screw hole 25 of the corresponding movable seat 2, and the middle section 42 acts as a pivot for locking and securing the corresponding pushing member 3 to the movable seat 2 to pivotally mount the corresponding pushing member 3 onto the movable seat 2, so that each pushing member 3 can be pivoted relative to the movable seat 2.

The fixed seat 1 has a through hole 13 formed thereon and configured to be corresponsive to the two pushing members 3, and the tail 32 of each pushing member 3 is passed and extended into the corresponding through hole 13, so that when the head 31 is pushed to rotate downward, the tail 32 will pivot towards the fixed seat 1 accordingly. Since the corresponding movable seat 2 can be moved relative to the fixed seat 1, therefore when each movable seat 2 is pivoted at the tail 32, each tail 32 will abut against a front side 131 of the corresponding through hole 13, and the front side 131 of the through hole 13 remains unmoved, so that the tail 32 will retreat, and each movable seat 2 will be pushed to a retreat distance along the withdrawing direction D relative to the fixed seat 1. In this embodiment, the tail 32 abutting against a side of the corresponding through hole 13 is in an arc shape to facilitate pushing the corresponding movable seat 2. In addition, the retreat distance of each movable seat 2 is greater than the depth of inserting the mainboard into the slot 5.

Figure 5:
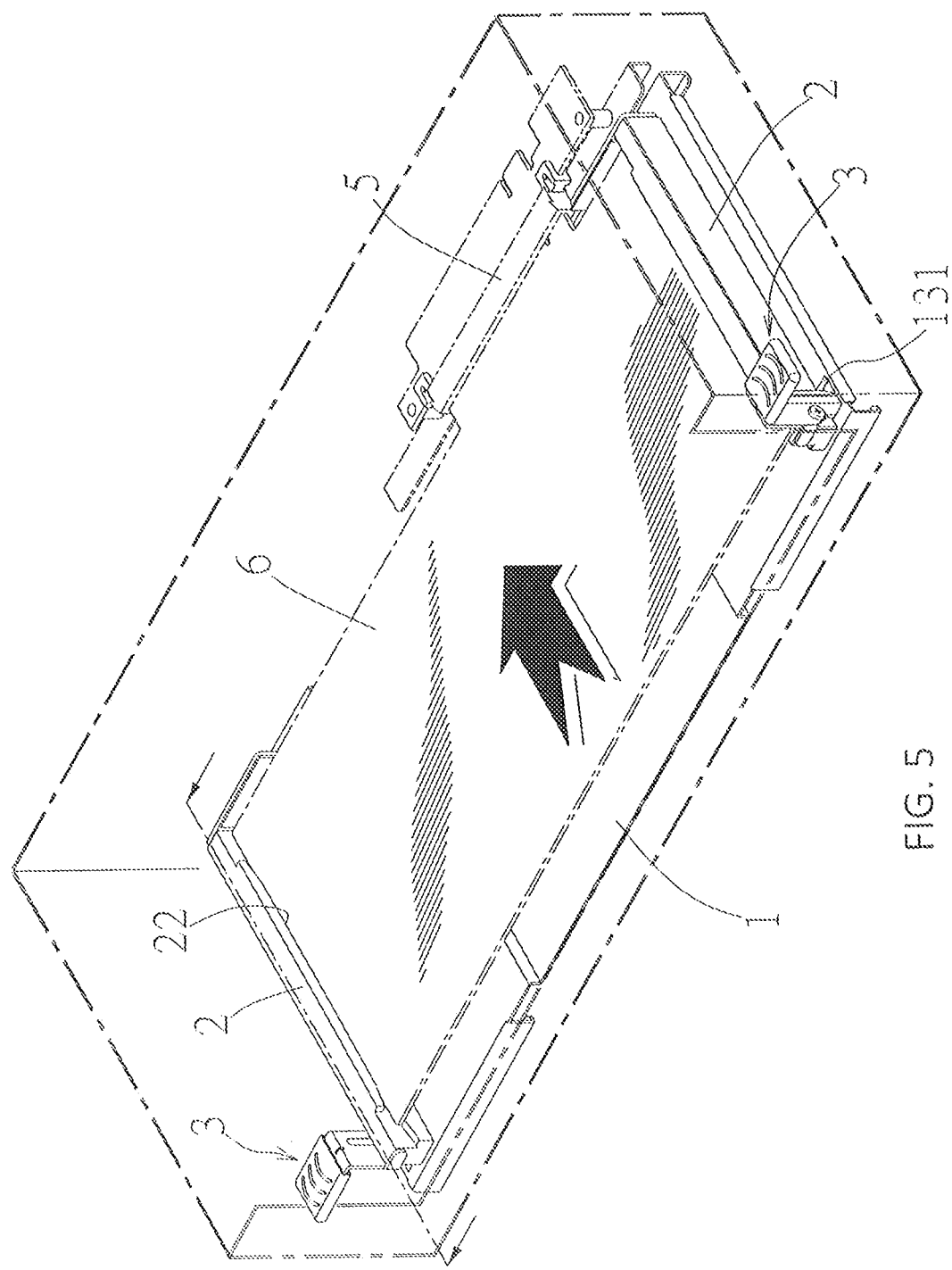
FIGS. 5 and 6 are schematic views showing a using status of the present invention, in which a mainboard is inserted into a slot.
Figure 6:
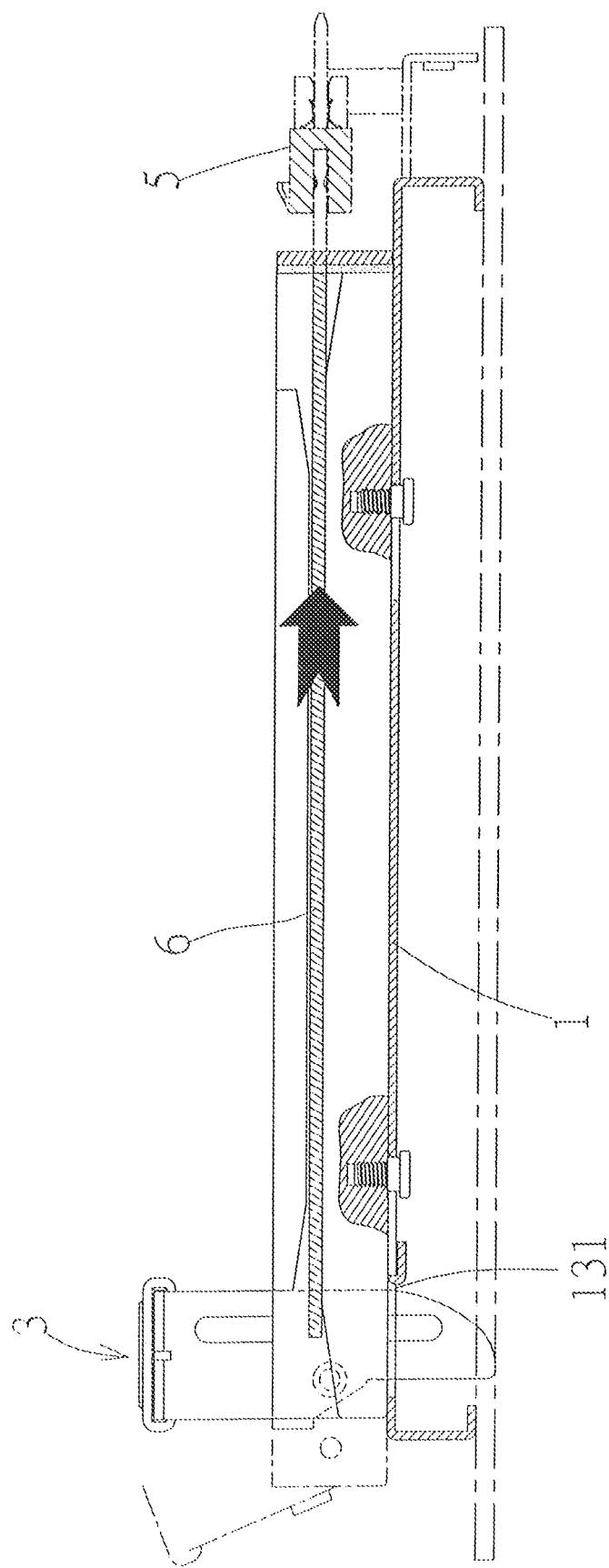
Figure 7:
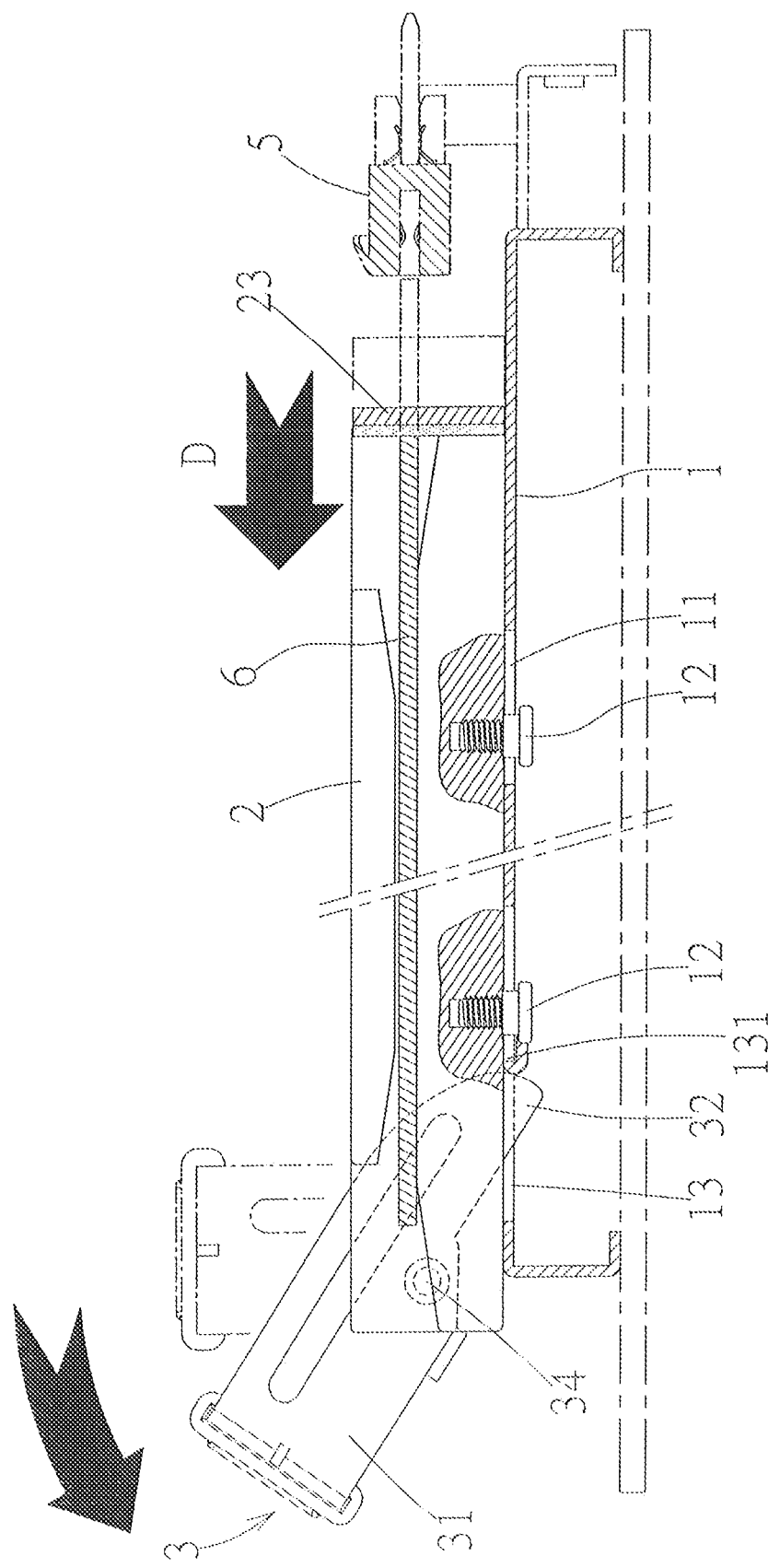
FIGS. 7 and 8 are schematic views showing a using status of the present invention, in which a mainboard is pulled out from a slot.
Figure 8:
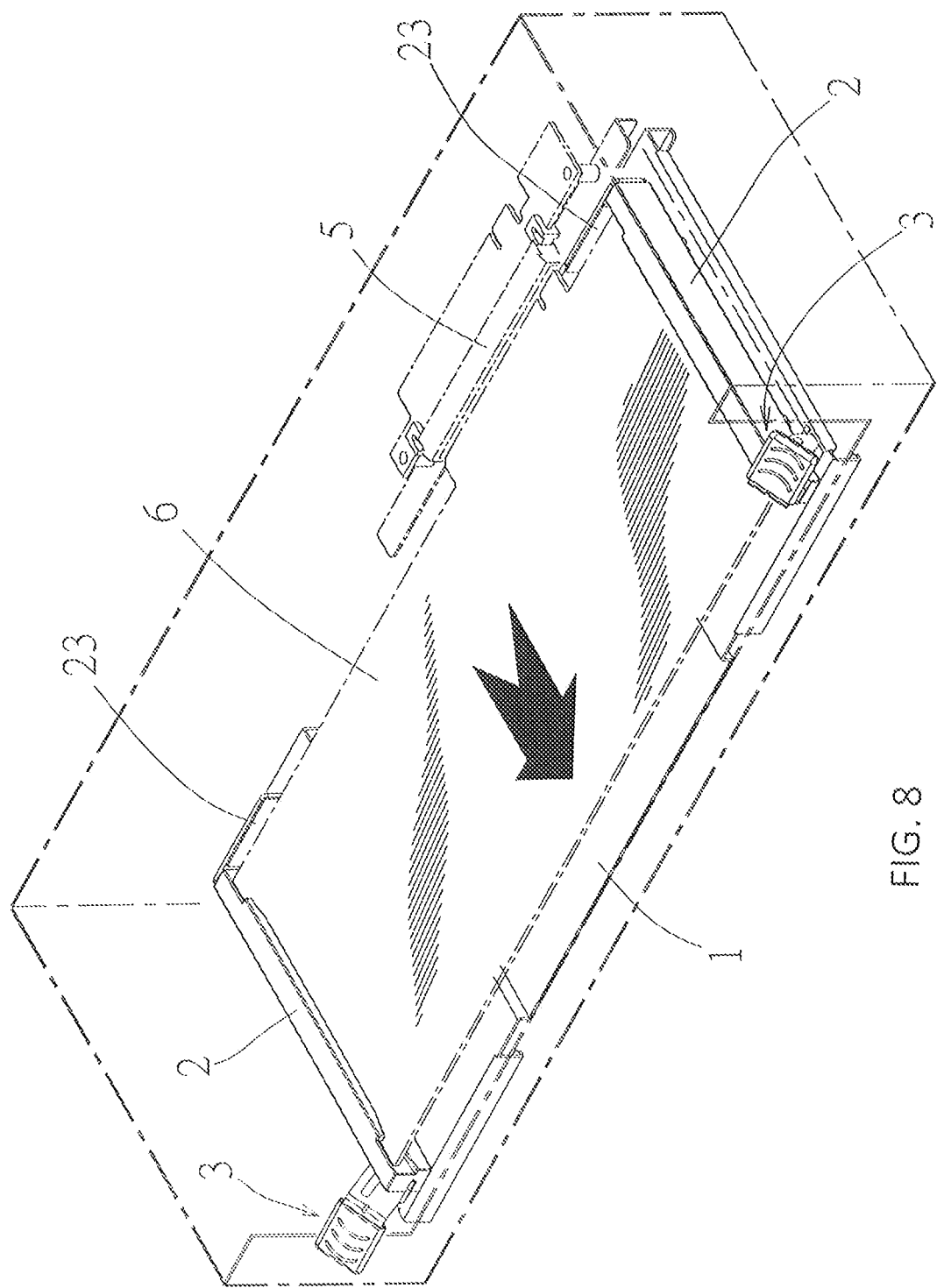

With the structure as shown in FIGS. 5 and 6, the mainboard 6 slides along the rail track 22 between the two movable seats 2 and is inserted into the slot 5. If it is necessary to pull out the mainboard 6 after testing, the operator just needs to push the head 31 of the two pushing members 3 backward as shown in FIGS. 7 and 8, so that the tail 32 is pivoted forward accordingly, and the movable seat 2 will be pushed to a retreat distance along the withdrawing direction D relative to the fixed seat 1. Now, the mainboard 6 is controlled by the pushing portion 23 to move the movable seat 2 synchronously, so that the operation and detach the mainboard 6 from the slot 5 and pull out the mainboard 6 easily.

In this embodiment, the corresponding movable seat 2 is pushed by each pushing member 3 to produce the retreat distance, and the length of each long hole 11 formed on the fixed seat 1 is greater than mainboard 6 the depth of inserting into the slot 5, so that when the mainboard 6 is retreated synchronously with the movable seats 2, the mainboard 6 can be separated from the slot 5 completely, and the mainboard 6 can be pulled out easily.

In summation of the description above, the present invention can make the withdrawal of the mainboard easier and more effort-saving without causing too much physical burden, so as to improve the efficiency of the mainboard testing. In addition, the invention also can ensure a correct withdraw of the mainboard to protect the product from damage or failure.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures. It is noteworthy that the embodiments and figures disclosed herein are to be considered illustrative rather than restrictive.

What is claimed is:

1. A labor-saving mainboard withdrawing structure for electronic devices, configured to be corresponsive to a slot, for withdrawing a mainboard out from the slot in a withdrawing direction, characterized in that the withdrawing structure comprises:
   a fixed seat;
   two movable seats, installed on both sides of the fixed seat, and limited to move in the withdrawing direction only, and having a space defined between the two movable seats for installing the mainboard, a rail track formed on an opposite side and extending along the withdrawing direction for slidably inserting the mainboard, and the two movable seats having a pushing portion separately for abutting against the mainboard; and
   two pushing members, corresponsively pivoted at one of the movable seats, and each pushing member having a head provided for operators to push and a tail abutting against the fixed seat, and a through hole being formed on the fixed seat and configured to be corresponsive to each respective pushing member, and the tail of each pushing member passing and extending into the corresponding through hole, and each head being pushed to pivot each tail, and each tail abuts against a front side of the corresponding through hole, and each movable seat being pushed in a retreat distance along the withdrawing direction relative to the fixed seat when each movable seat is pivoted at each tail, so as to detach the mainboard from the slot by pushing each pushing portion.

2. The labor-saving mainboard withdrawing structure for electronic devices as claimed in claim 1, wherein the retreat distance is greater than the depth of inserting the mainboard into the slot, so that the mainboard can be separated completely from the slot when the movable seat is moved.

3. The labor-saving mainboard withdrawing structure for electronic devices as claimed in claim 1, wherein each pushing member has a corresponding positioning hole formed between the head and the tail, and a positioning member is passed through the positioning hole to position each pushing member onto the movable seat.

4. The labor-saving mainboard withdrawing structure for electronic devices as claimed in claim 3, wherein each positioning member comprises a threaded section, a middle section and a cap integrally and sequentially coupled to each other, and the middle section has an outer diameter falling within a range between the outer diameter of the threaded section and the outer diameter of the cap, and the threaded section is locked into a screw hole of the movable seat, and the middle section is passed into the corresponding positioning hole.

5. The labor-saving mainboard withdrawing structure for electronic devices as claimed in claim 1, wherein the tail of each pushing member abutting against a side with the corresponding through hole is in an arc shape.

6. The labor-saving mainboard withdrawing structure for electronic devices as claimed in claim 1, wherein the fixed seat has at least one long hole configured to be corresponsive to the two movable seats and extending along the withdrawing direction, and the movable seat has a limit member configured to be corresponsive to the long hole and passed through the long hole, so that the movable seat is limited by the limit member to move within the range of the long hole only.

7. The labor-saving mainboard withdrawing structure for electronic devices as claimed in claim 6, wherein each long hole has a length greater than the depth of inserting the mainboard into the slot, so that the mainboard can be separated completely from the slot when the movable seat is moved.

8. The labor-saving mainboard withdrawing structure for electronic devices as claimed in claim 6, wherein each limit member comprises a threaded section, a middle section and a cap integrally and sequentially coupled to each other, and the middle section has an outer diameter falling within a range between the outer diameter of the threaded section and the outer diameter of the cap, and the threaded section is locked into a screw hole of the movable seat, and the middle section is passed into the long hole.

* * * * *